United States Patent
Park et al.

(10) Patent No.: US 7,115,470 B2
(45) Date of Patent: Oct. 3, 2006

(54) METHODS OF FABRICATING FLASH MEMORY CELL HAVING SPLIT-GATE STRUCTURE USING SPACER OXIDATION PROCESS

(75) Inventors: Jae-Hyun Park, Yongin-si (KR); Jae-Min Yu, Seoul (KR); Chul-Soon Kwon, Seoul (KR); In-gu Yoon, Suwon-si (KR); Eung-yung Ahn, Suwon-si (KR); Jung-ho Moon, Yongin-si (KR); Yong-Sun Lee, Seoul (KR); Sung-Yung Jeon, Yongin-si (KR)

(73) Assignee: Samsung Electronics, Ltd., Co., (KR)

( * ) Notice: Subject to any disclaimer, the term of this patent is extended or adjusted under 35 U.S.C. 154(b) by 168 days.

(21) Appl. No.: 10/840,803

(22) Filed: May 7, 2004

(65) Prior Publication Data

US 2005/0063208 A1    Mar. 24, 2005

(30) Foreign Application Priority Data

Sep. 23, 2003    (KR)    .................... 10-2003-0066011

(51) Int. Cl.
*H01L 21/336*    (2006.01)

(52) U.S. Cl. .................. 438/257; 438/258; 438/259; 438/E29.129; 438/E29.3; 257/315; 257/316; 257/E21.42; 257/E21.68

(58) Field of Classification Search .............. None
See application file for complete search history.

(56) References Cited

U.S. PATENT DOCUMENTS 6,165,845 A * 12/2000 Hsieh et al. ............... 438/260

FOREIGN PATENT DOCUMENTS

JP    11-284084    10/1999

* cited by examiner

*Primary Examiner*—Dung Le
(74) *Attorney, Agent, or Firm*—Mills & Onello LLP

(57) ABSTRACT

There is provided a method of fabricating a split-gate flash memory cell using a spacer oxidation process. An oxidation barrier layer is formed on a floating gate layer, and an opening to expose a portion of the floating gate layer is formed in the oxidation barrier layer. Subsequently, a spacer is formed on a sidewall of the opening with a material layer having insulation property by oxidizing, and an inter-gate oxide layer pattern between a floating gate and a control gate is formed in the opening while the spacer is oxidized by performing an oxidation process.

20 Claims, 16 Drawing Sheets

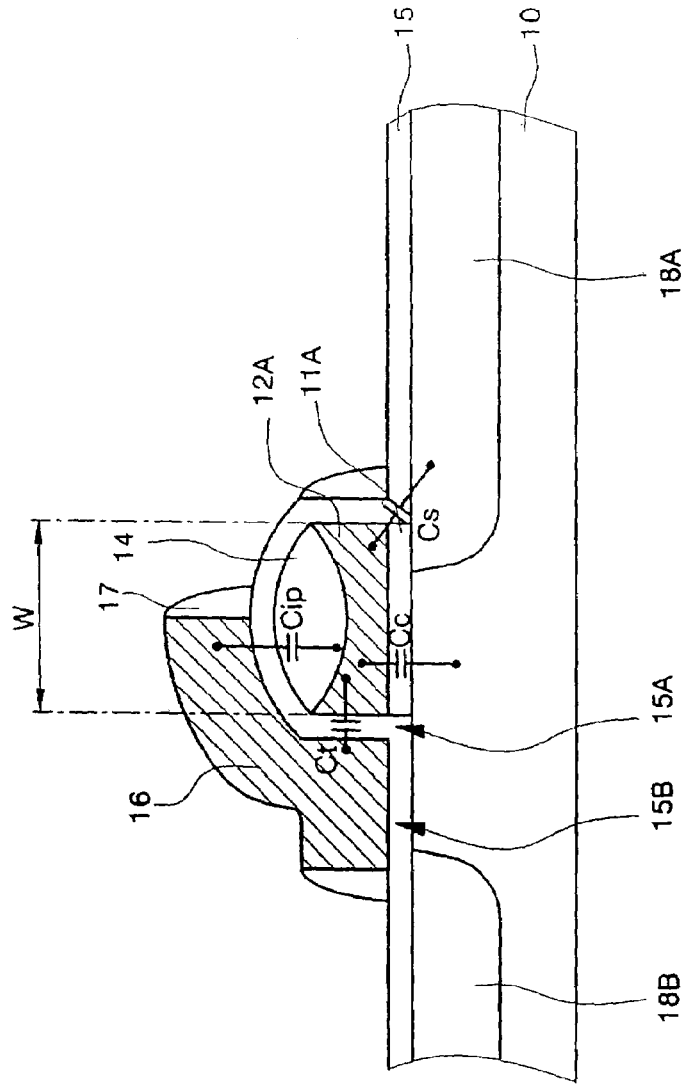

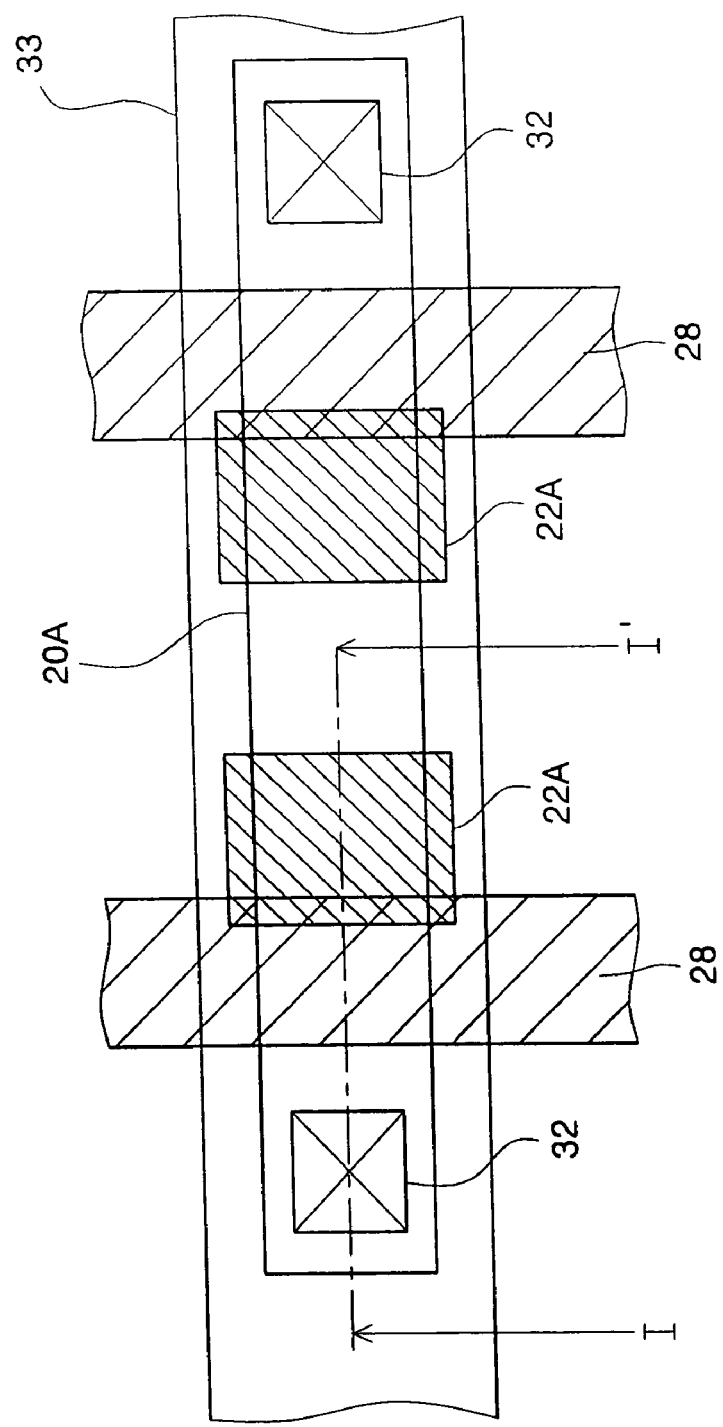

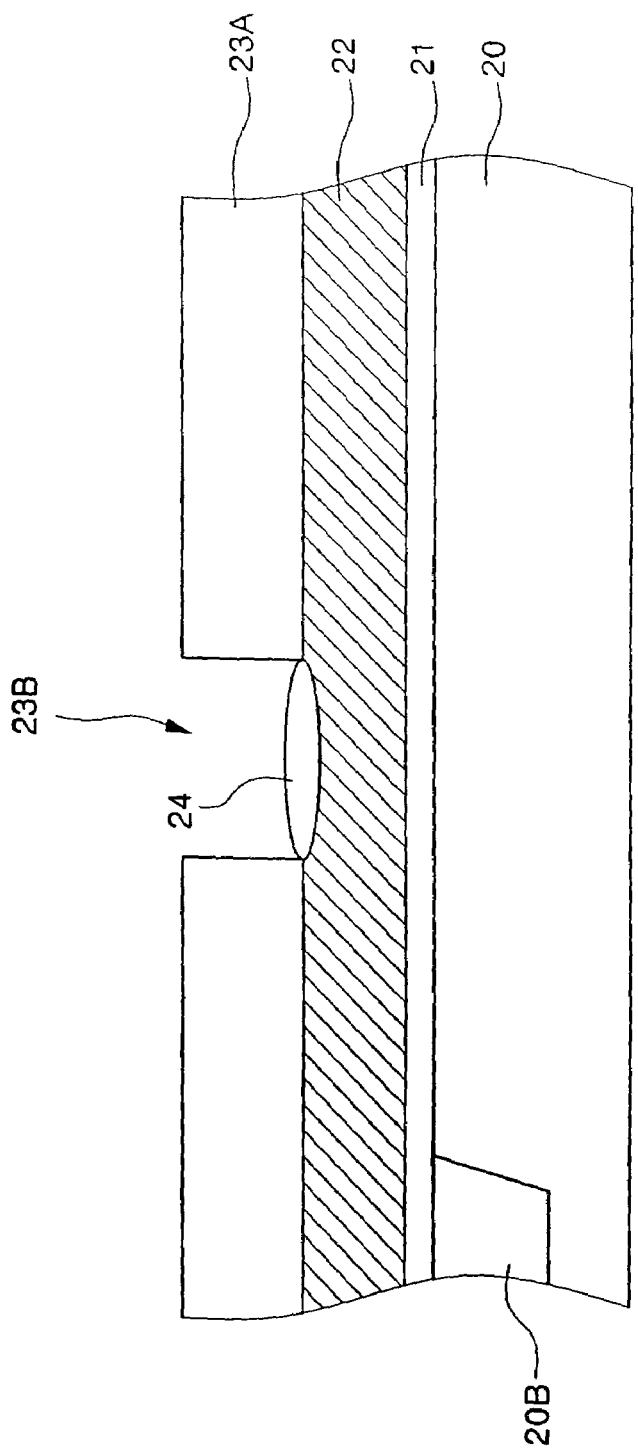

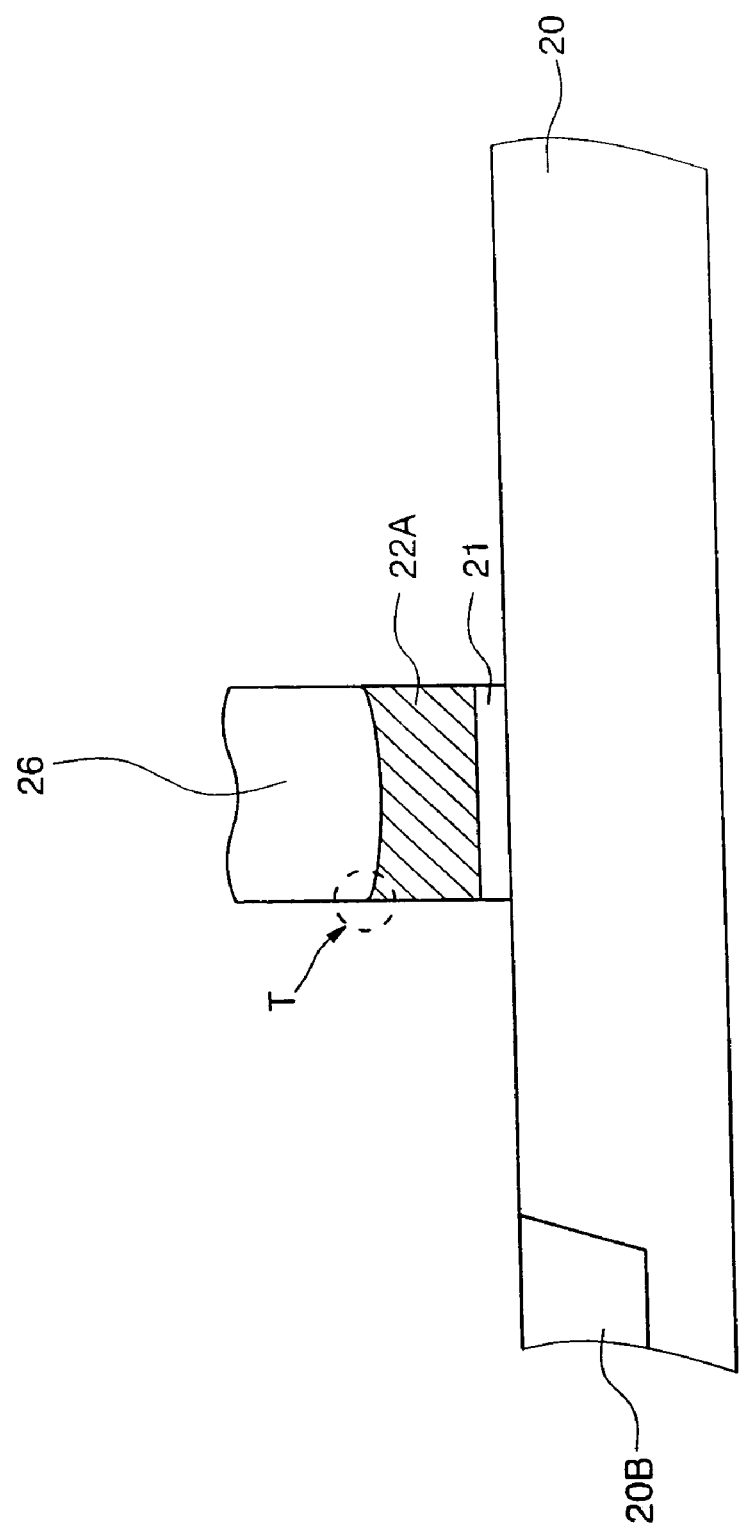

METHODS OF FABRICATING FLASH MEMORY CELL HAVING SPLIT-GATE STRUCTURE USING SPACER OXIDATION PROCESS

CROSS-REFERENCE TO RELATED APPLICATION

This application claims the benefit of Korean Patent Application No. 2003-66011, filed on Sep. 23, 2003, the contents of which are hereby incorporated herein by reference in their entirety.

BACKGROUND OF THE INVENTION

A flash memory device is a type of a nonvolatile memory device being capable of retaining data with a power supply cut off, and is a highly-integrated device made using an EPROM (erasable programmable read only memory) and an EEPROM (electrically erasable programmable read only memory).

A conventional flash memory cell has a stack-gate structure including a tunnel oxide layer, a floating gate, an insulating layer, and a control gate, which are stacked on a semiconductor substrate between a source and a drain.

One drawback associate with the stack-gate structure is an over-erase phenomenon, and as one of the efforts to solve the problem, there has been introduced a flash memory cell having a split gate structure. Japanese Laid Open Disclosure No. 1999-284084, entitled, "Nonvolatile Semiconductor Memory Device and its Manufacture," by Otani Toshiharu, discloses a method of fabricating a split gate using a local oxidation of silicon (LOCOS) process.

FIGS. 1A to 1E illustrate in detail a method of fabricating a flash memory cell having a split gate structure in accordance with prior art.

As shown in FIG. 1A, a gate oxide layer 11, a first polysilicon layer 12, and a silicon nitride layer 13 are stacked on a semiconductor substrate 10.

Then, as shown in FIG. 1B, by patterning the silicon nitride layer 13, there is formed a silicon nitride layer pattern 13A having an opening 13B therein, exposing a portion of the first polysilicon layer 12.

Then, as shown in FIG. 1C, a poly oxide layer 14 is formed by performing a LOCOS process using the silicon nitride layer pattern 13A as an oxidation stop layer so as to oxidize a portion of the exposed first polysilicon layer 12.

Then, as shown in FIG. 1D, a floating gate 12A is formed under the poly oxide layer 14 by removing the silicon nitride layer pattern 13A and etching the first polysilicon layer 12 using the poly oxide layer 14 as an etch mask.

Then, as shown in FIG. 1E, an oxide layer 15 is formed on the semiconductor substrate 10 and the poly oxide layer 14, and then, a control gate 16 overlapping a portion of the floating gate 12A is formed of a second polysilicon layer. Then, the processes of forming spacers 17 on the sidewalls of the floating gate 12A and the control gate 16, and forming source/drain 18A, 18B inside the semiconductor substrate 10, and the like are performed. The oxide layer 15 functions as a tunnel oxide layer 15A in the region between the floating gate 12A and the control gate 16, and functions as a gate oxide layer 15B in the region between the semiconductor substrate 10 and the control gate 16.

However, the LOCOS process in the conventional method of fabricating a flash memory cell having a split gate structure described above has a difficulty in forming the poly oxide layer 14, being formed for the insulation between the floating gate 12A and the control gate 16, with a uniform thickness. Further, the LOCOS process has some other drawbacks such as causing a heat budget due to the thermal oxidation performed at a temperature of about 800° C., and a smiling effect on the boundary of the gate oxide layer to be thickened. Therefore, the degradation of cell characteristics may result, and malfunctioning may happen during programming and erasing operations.

Many parasitic capacitors exist in the flash memory cell having the split gate structure fabricated by the method in accordance with the conventional approach described above. Referring to FIG. 1E, there exists a tunnel capacitor ($C_t$) between the sidewalls of the control gate 16 and the floating gate 12A, and there exists a gate interlayer capacitor ($C_{ip}$) between the control gate 16 and the upper surface of the floating gate 12A. Further, there exists a channel capacitor ($C_c$) between the floating gate 12A and the semiconductor substrate 10, and there exists a source capacitor ($C_s$) between the floating gate 12A and the source 18A.

In programming the flash memory cell having the split gate structure as shown in FIG. 1E, a high voltage is applied on the source 18A, and a grounding voltage is applied on the drain 18B. The electrons generated in the drain 18B move to the source 18A through the channel region formed in the semiconductor substrate 10 by the program voltage applied on the control gate 16. The program voltage is lower than the voltage applied on the source 18A and higher than the threshold voltage for the formation of the channel region. Some of the electrons being moved to the source 18A are excited by the potential difference between the drain 18B and the floating gate 12A coupled by the high voltage applied on the source 18A, and are injected into the floating gate 12A. That is, the program operation is performed by a hot carrier injection to the floating gate 12A.

In this case, a program coupling ratio ($r_p$) can be represented by Equation 1 as follows:

$$r_p = \frac{C1 + C2}{C1 + C2 + C3 + C4} \qquad \text{[Equation 1]}$$

In Equation 1, 'C1', 'C2', 'C3', and 'C4' are the capacitance of the source capacitor ($C_s$), the capacitance of the channel capacitor ($C_c$), the capacitance of the tunnel capacitor ($C_t$), and the capacitance of the gate interlayer capacitor ($C_{ip}$), respectively.

Further, in erasing the flash memory cell having the split gate structure, if a high voltage is applied on the control gate 16, and grounding voltages are applied on the source 18A and the drain 18B, the electrons charged in the floating gate 12A are removed to the control gate 16 by the high voltage applied on the control gate 16, that is, the electrons charged in the floating gate 12A are erased by the F-N (Fowler-Nordheim) tunneling effect.

In this case, an erase coupling ratio ($r_E$) can be represented by Equation 2 with the capacitances (C1, C2, C3, C4) of the parasitic capacitors ($C_s$, $C_c$, $C_t$, $C_{ip}$) as follows:

$$r_E = \frac{C3 + C4}{C1 + C2 + C3 + C4} \qquad \text{[Equation 2]}$$

The width 'W' of the poly oxide layer 14 is reduced with the increase in integration of the device. That is, as shown in FIG. 1B, when the width of the exposed polysilicon layer 12 is reduced, the width of the opening 13B, provided for the formation of the poly oxide layer 14, is reduced, and so, the thickness of the poly oxide layer 14, produced by the LOCOS process, is reduced. The reduction of the thickness of the poly oxide layer 14 increases the capacitance of the gate interlayer parasitic capacitor ($C_{ip}$) between the control gate 16 and the floating gate 12A, thereby resulting in degradation of the device characteristics. That is, if the capacitance of the gate interlayer capacitor ($C_{ip}$), generated between the floating gate 12A and the control gate 16, is increased, the voltage, applied on the floating gate 12A during programming, is reduced, thereby resulting in decreasing the program efficiency.

SUMMARY OF THE INVENTION

The present invention provides a method of fabricating a split-gate flash memory cell using a spacer oxidation process.

According to an aspect of the present invention, a method of fabricating a split-gate flash memory cell comprises forming a first gate insulating layer, a floating gate layer and an oxidation barrier layer on a semiconductor substrate, sequentially. An oxidation barrier pattern is formed to have an opening to expose a portion of the floating gate layer by patterning the oxidation barrier layer. A spacer is formed on a side of the opening. An inter-gate oxide layer pattern is formed in the opening by oxidizing the spacer and the exposed floating gate layer. The oxidation barrier pattern is removed. A floating gate is formed on a lower part of the inter-gate oxide layer pattern by etching the floating gate layer using the inter-gate oxide layer pattern as an etch mask. A second gate insulating layer is formed on the semiconductor substrate having the floating gate. A control gate is formed to overlap with a part of the floating gate on the second gate insulating layer.

In one embodiment, the spacer is formed of a polysilicon layer.

The oxidation process can be performed at a temperature of 750° C. to 950° C.

The oxidation barrier layer can be formed of a silicon nitride layer.

The step of forming the spacer can include forming a polysilicon layer covering the oxidation barrier pattern, and etching the polysilicon layer anisotropically.

An etch stop layer can be formed at a bottom of the opening, after forming the oxidation barrier pattern. The etch stop layer can be formed by oxidizing the floating gate layer exposed after forming the opening. The floating gate layer can be formed of a polysilicon layer. The floating gate can be formed to have a tip on a top end thereof.

In one embodiment, the control gate is formed to have one end thereof covering a portion of the inter-gate oxide layer pattern and overlapping with a portion of the floating gate, and the other end thereof overlapping with the semiconductor substrate.

According to another aspect of the present invention, a method of fabricating a split-gate flash memory cell comprises defining an active area by forming an isolation layer on a semiconductor substrate. A first gate insulating layer, a floating gate layer and an oxidation barrier layer are formed on the active area, sequentially. An oxidation barrier pattern is formed to have an opening to expose a portion of the floating gate layer by patterning the oxidation barrier layer. Both ends of the opening overlap with the isolation layer. A spacer is formed on a side of the opening. An inter-gate oxide layer pattern is formed in the opening by oxidizing the spacer and the exposed floating gate layer. The oxidation barrier pattern is removed. A floating gate is formed on a lower part of the inter-gate oxide layer pattern by etching the floating gate layer using the inter-gate oxide layer pattern as an etch mask. A second gate insulating layer is formed on the active area having the floating gate. A control gate is formed to overlap with a portion of the floating gate on the second gate insulating layer. A source and a drain separated from each other are formed on the active area, between which the floating gate and the control gate are placed.

In one embodiment, the spacer is formed of a polysilicon layer.

The the oxidation process can be performed at a temperature of 750° C. to 950° C.

The oxidation barrier layer can be formed of a silicon nitride layer.

In one embodiment, forming the spacer comprises forming a polysilicon layer covering the oxidation barrier pattern, and etching the polysilicon layer anisotropically.

In one embodiment, an etch stop layer is formed at a bottom of the opening, after forming the oxidation barrier pattern. The floating gate layer can be formed of a polysilicon layer. The etch stop layer can be formed by oxidizing the exposed floating gate layer. The floating gate can be formed to have a tip on a top end thereof.

In one embodiment, the control gate is formed to have one end thereof covering a portion of the inter-gate oxide layer pattern and overlapping with a portion of the floating gate, and the other end thereof overlapping with the active area.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

FIGS. 1A to 1E are cross-sectional views illustrating a process of fabricating a flash memory cell according to the prior art.

FIG. 2 is a plan view illustrating a process of fabricating a split-gate flash memory cell according to an embodiment of the present invention.

FIGS. 3A to 3J are cross-sectional views illustrating a process of fabricating a flash memory cell taken along line I–I' of FIG. 2.

DETAILED DESCRIPTION OF THE INVENTION

Figure 1A:
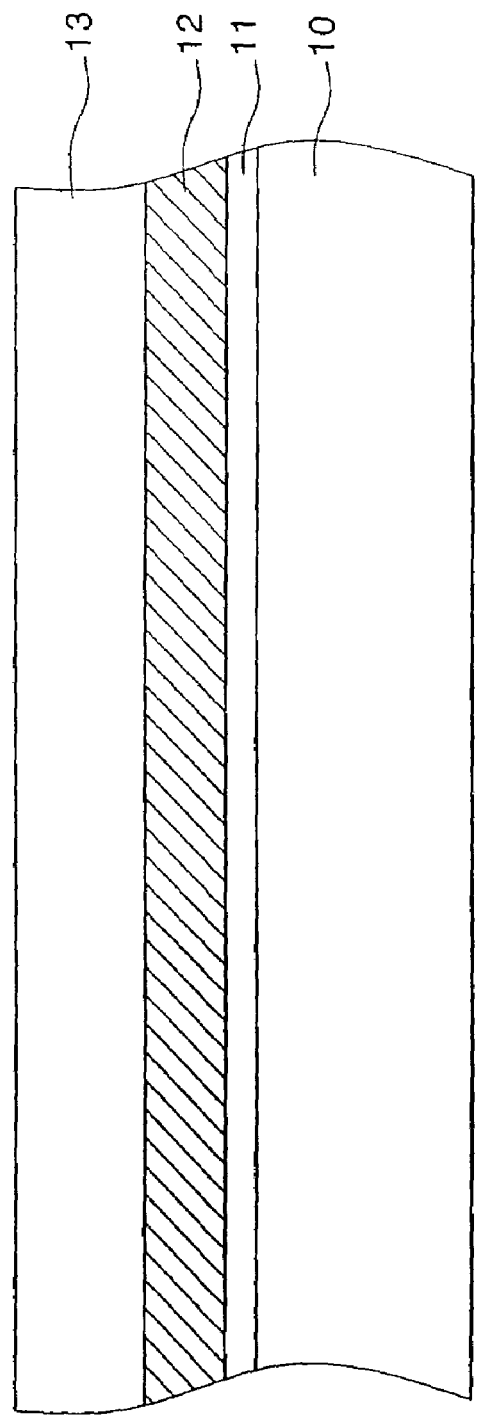
Figure 1B:
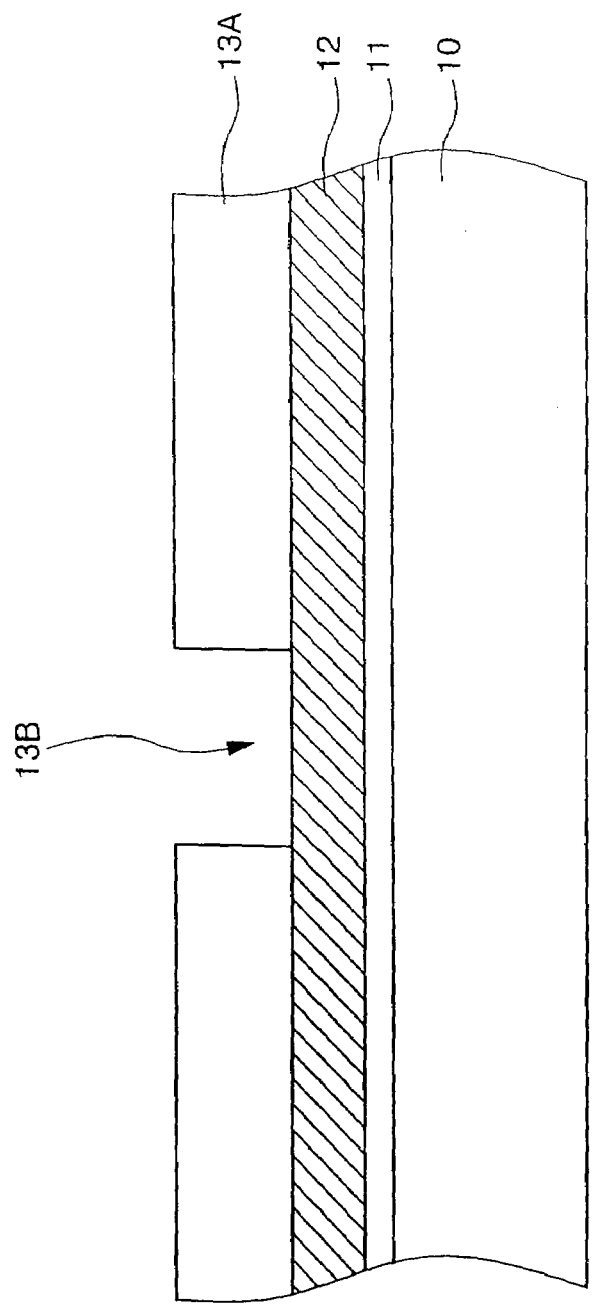
Figure 1C:
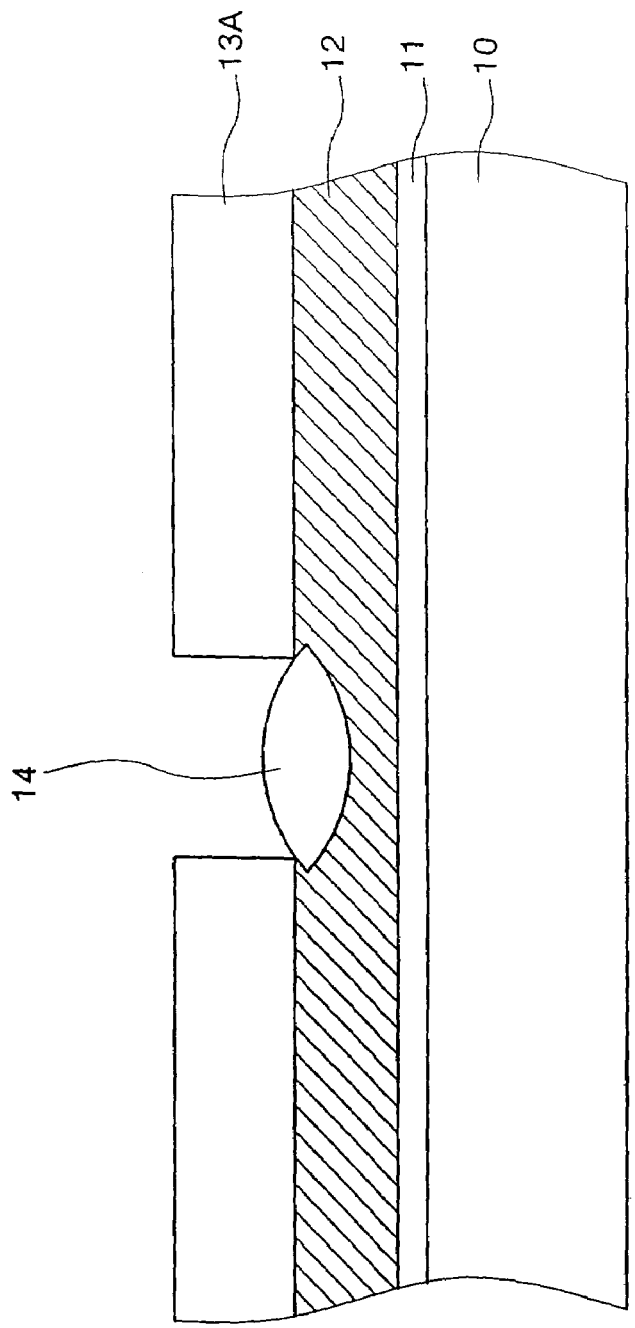
Figure 1D:
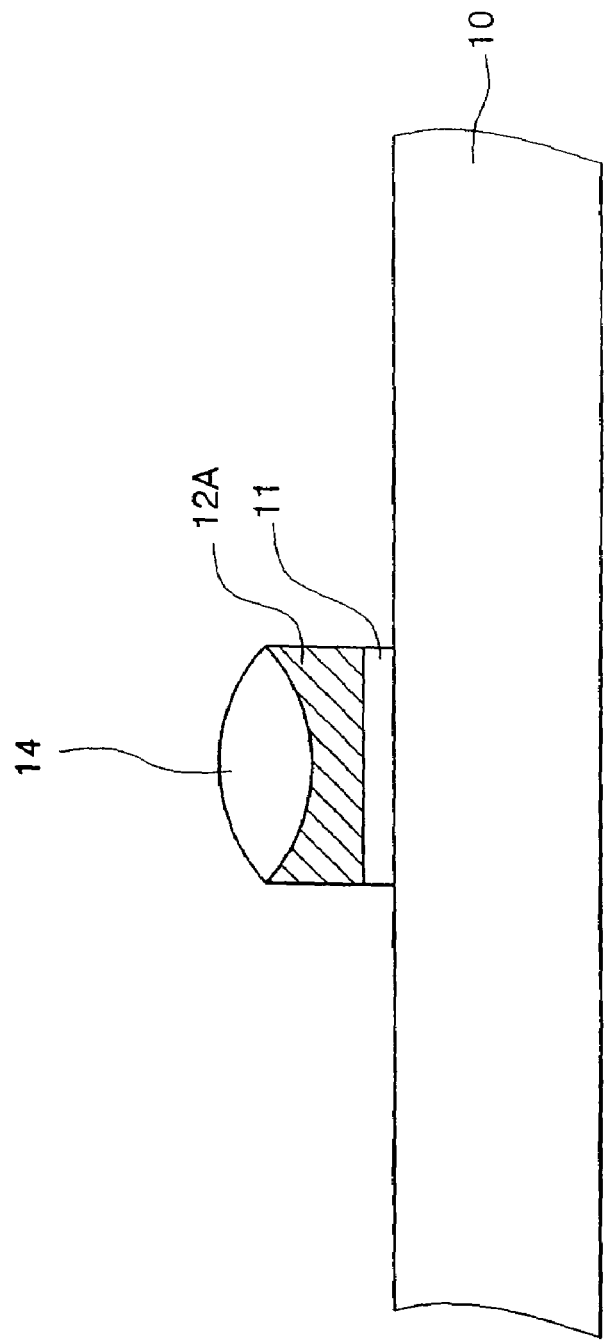

The present invention will now be described more fully hereinafter with reference to the accompanying drawings, in which preferred embodiments of the invention are shown. In the drawings, the thickness and length of layers and regions are exaggerated for clarity.

FIG. 2 is a plan view illustrating a method of fabricating a flash memory cell having a split-gate structure according to an embodiment of the present invention. FIGS. 3A to 3J are cross-sectional views taken along line I–I' of FIG. 2 illustrating a process of fabricating a flash memory cell.

Hereinafter, referring to FIG. 2 and FIGS. 3A to 3J, a method of fabricating the flash memory cell having the split-gate structure according to an embodiment of the present invention will be described.

Figure 3A:
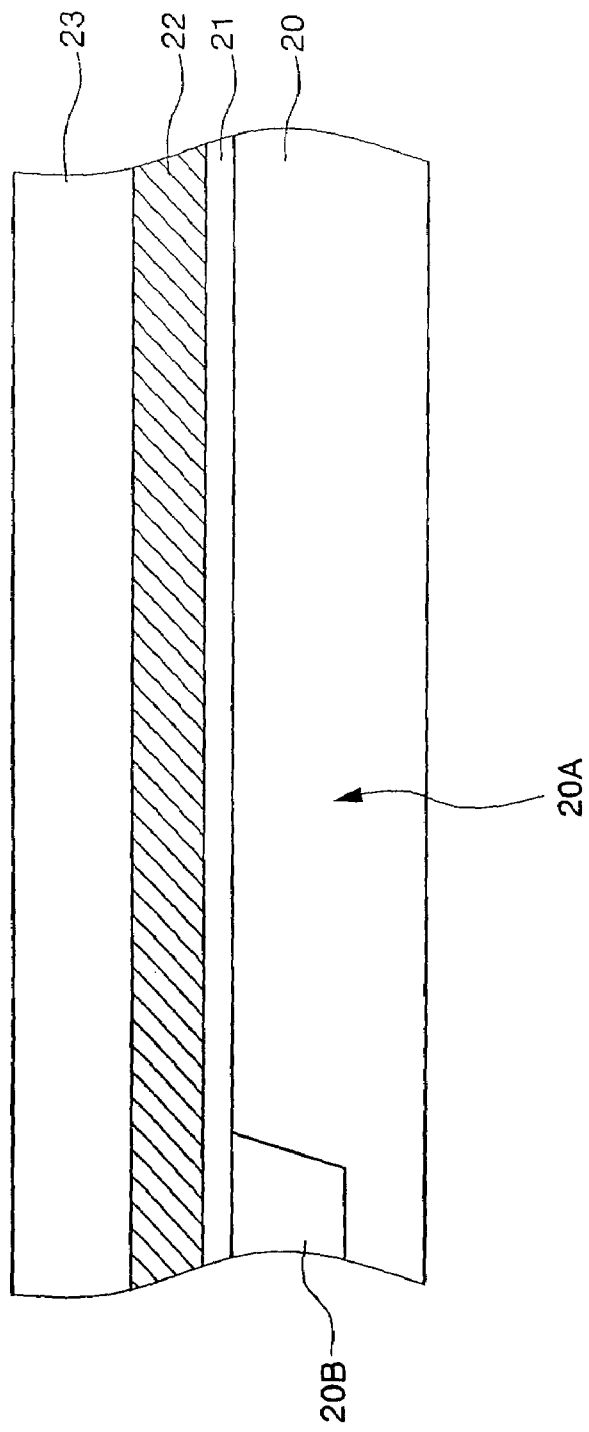

Referring to FIGS. 2 and 3A, an active area 20A is defined by forming an isolation layer 20B on a predetermined area of a semiconductor substrate 20. A first gate insulating layer 21, a floating gate layer 22 and an oxidation barrier layer 23 are formed on the semiconductor substrate 20 having the isolation layer 20B, sequentially. In the present embodiment, the first gate insulating layer 21 is formed of a silicon oxide layer having a thickness of 50 to 100 Å, the floating gate layer 22 is formed of a polysilicon layer having a thickness of 600 to 800 Å, and the oxidation barrier layer 23 is formed of a silicon nitride layer having a thickness of 900 to 1100 Å.

Figure 3B:
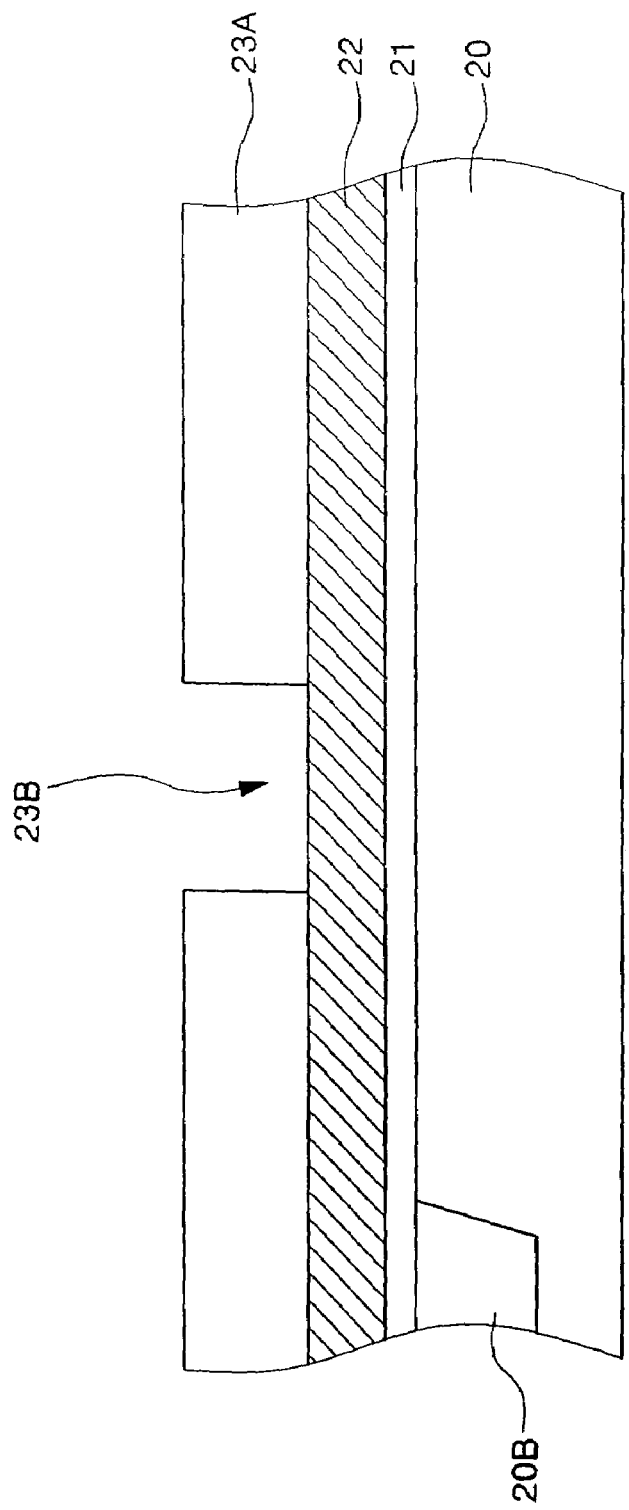

Referring to FIG. 3B, a portion of the floating gate layer 22 is exposed by patterning the oxidation barrier layer 23 to form an oxidation barrier pattern 23A having an opening 23B therein. The opening 23B is coincident with a shape of a floating gate formed in a subsequent process. In the present embodiment, both ends of the opening 23B are formed to be overlapped with the isolation layer 23B according to the shape of the floating gate 22A shown in FIG. 2.

Referring to FIG. 3C, an etch stop layer 24 is formed on the exposed floating gate layer 22. The etch stop layer 24 is formed to prevent the floating gate layer 22 from being damaged on an etching process for forming a spacer on a sidewall of the opening 23B in a subsequent process. Accordingly, in case that the spacer is formed of a material having etching selectivity to the floating gate layer 22, it can be omitted to form the etch stop layer 24. In the present embodiment, the etch stop layer 24 is formed by oxidizing the exposed floating gate layer 22. The etch stop layer 24 is formed to have a thickness of 90 to 110 Å.

Figure 3D:
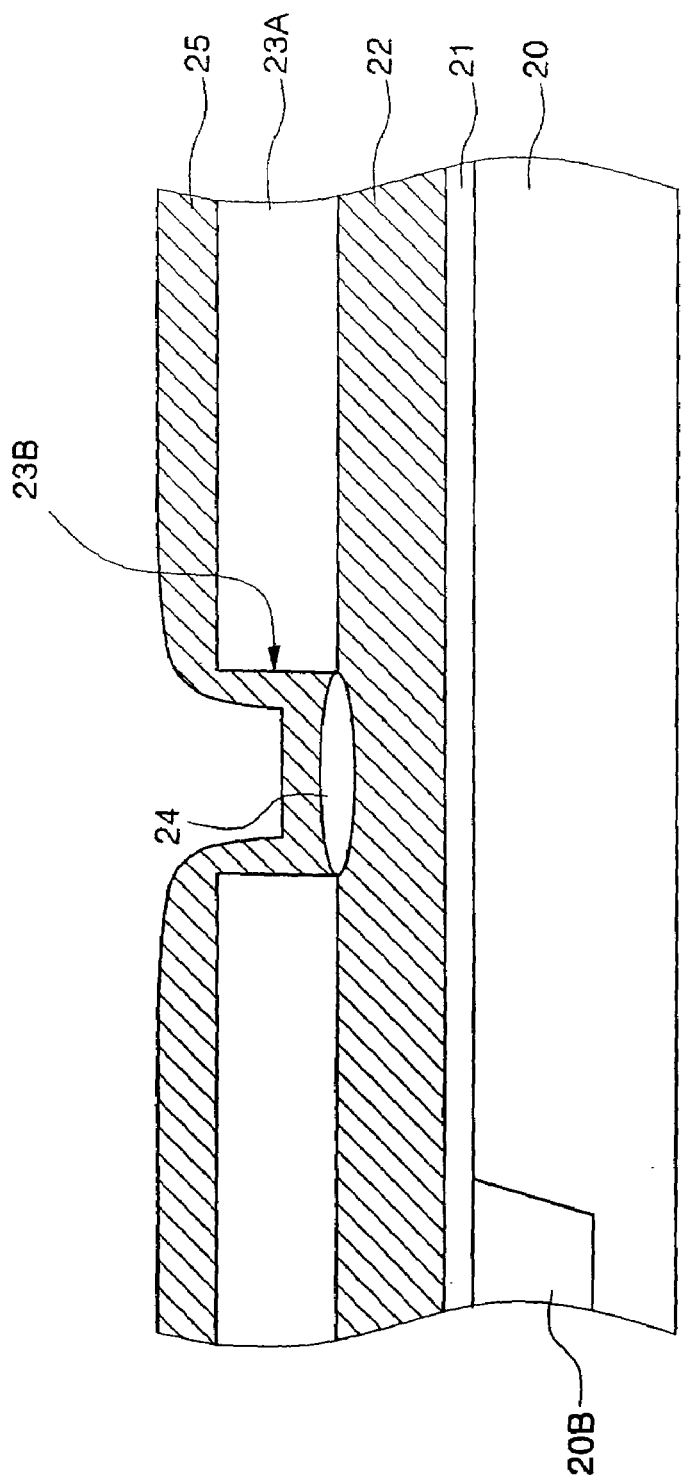

Referring to FIG. 3D, a material layer 25 is formed on the upper surface of the semiconductor substrate 20 on which the etch stop layer 24 is completely formed in order to fill the opening 23B. The material layer 25 is formed of a material having insulation property by oxidation. Moreover, the thickness of an inter-gate oxide layer pattern formed in a subsequent process depends on a width of a spacer resulting from etching the material layer 25. Therefore, the thickness of the material layer 25 is determined by considering the thickness of the inter-gate oxide layer pattern formed in a subsequent process. In the present embodiment, the material layer 25 is formed of a polysilicon layer having a thickness of 450 to 550 Å.

Figure 3E:
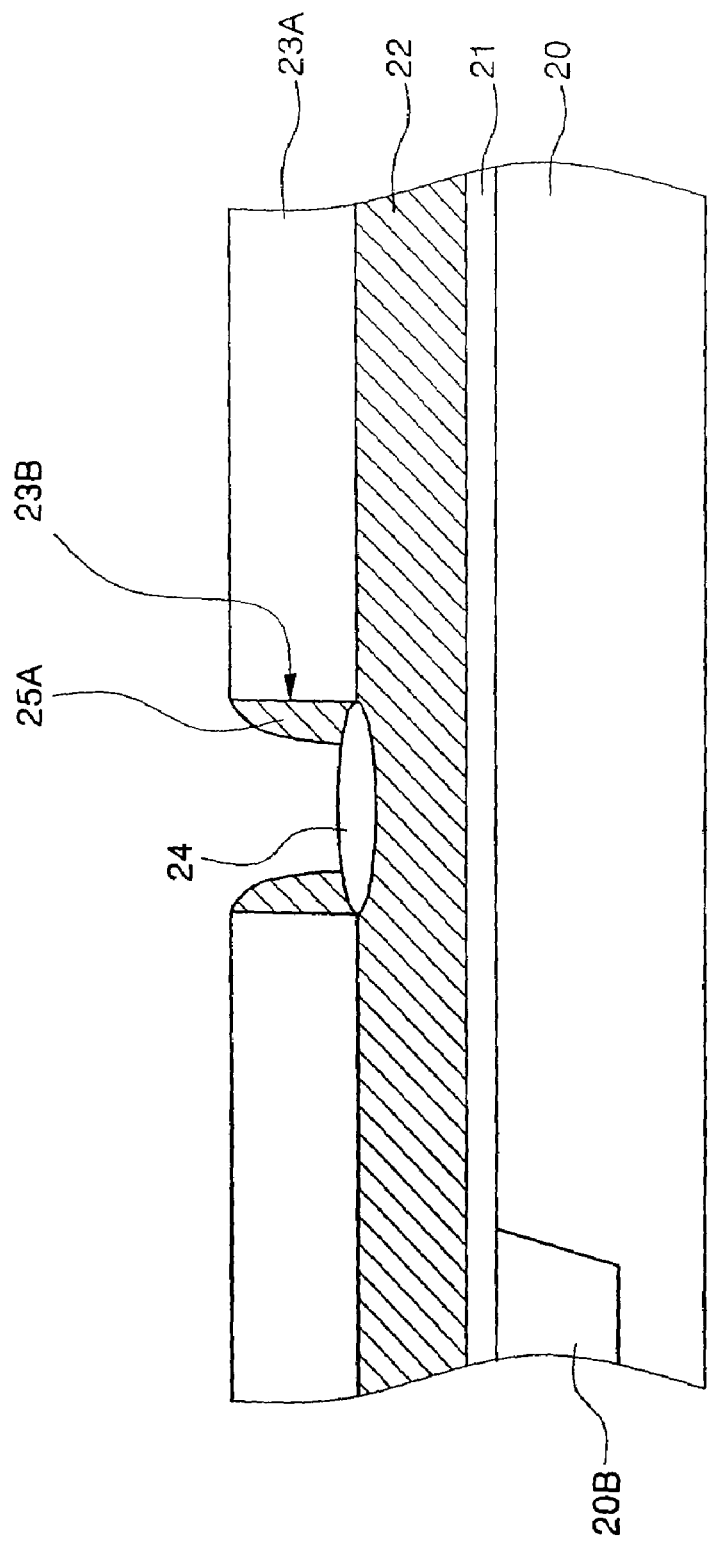

Referring to FIG. 3E, a spacer 25A is formed on a sidewall of the opening 23B by anisotropically etching the material layer 25. A portion of the etch stop layer 24 is exposed by forming the spacer 25A. In the case in which the etch stop layer 24 is not formed, a portion of the floating gate layer 22 is exposed between the spacer 25A.

Figure 3F:
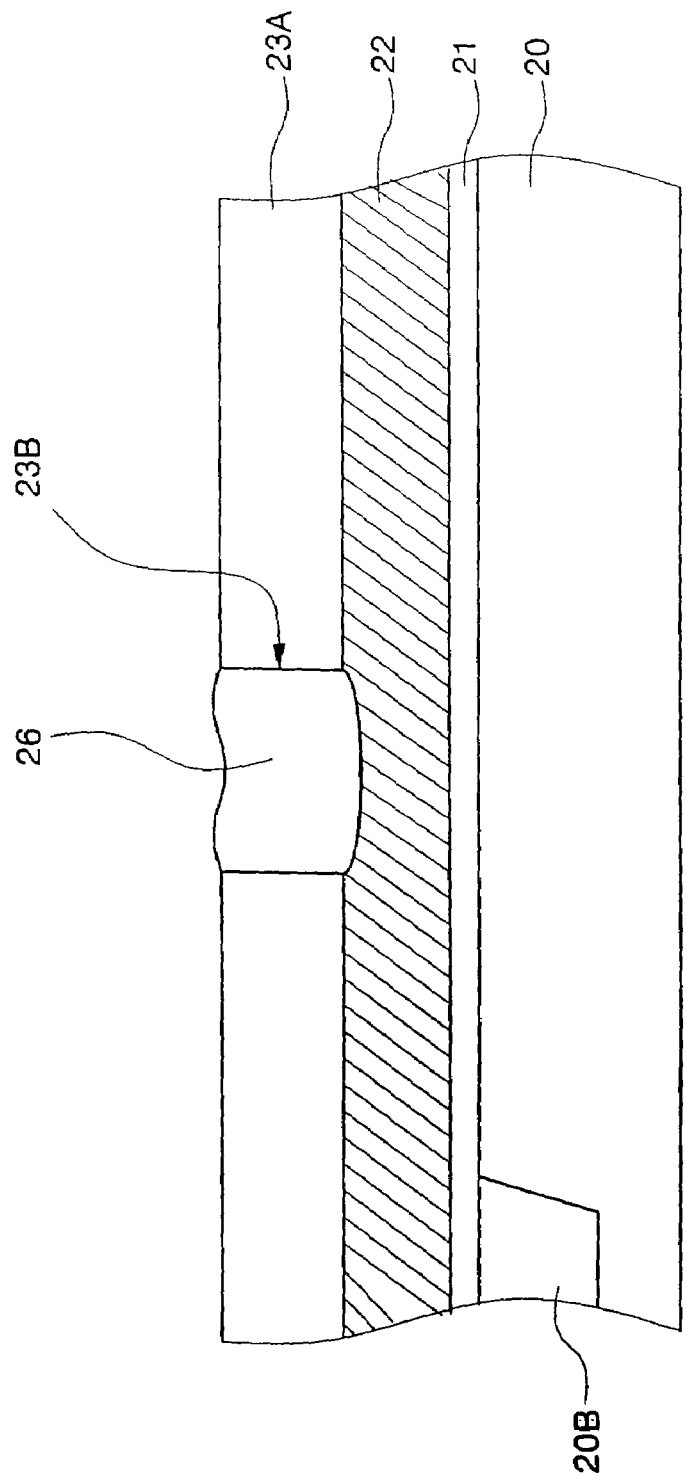

Referring to FIG. 3F, an oxidation process is performed to oxidize the spacer 25A at a temperature of 750 to 950° C., thus, an inter-gate oxide layer pattern 26 filling the interior of the opening 23B may be obtained. As described above, when the etch stop layer 24 is formed by oxidizing the floating gate layer 22, the etch stop layer 24 becomes a part of the inter-gate oxide layer pattern 26.

Figure 3G:
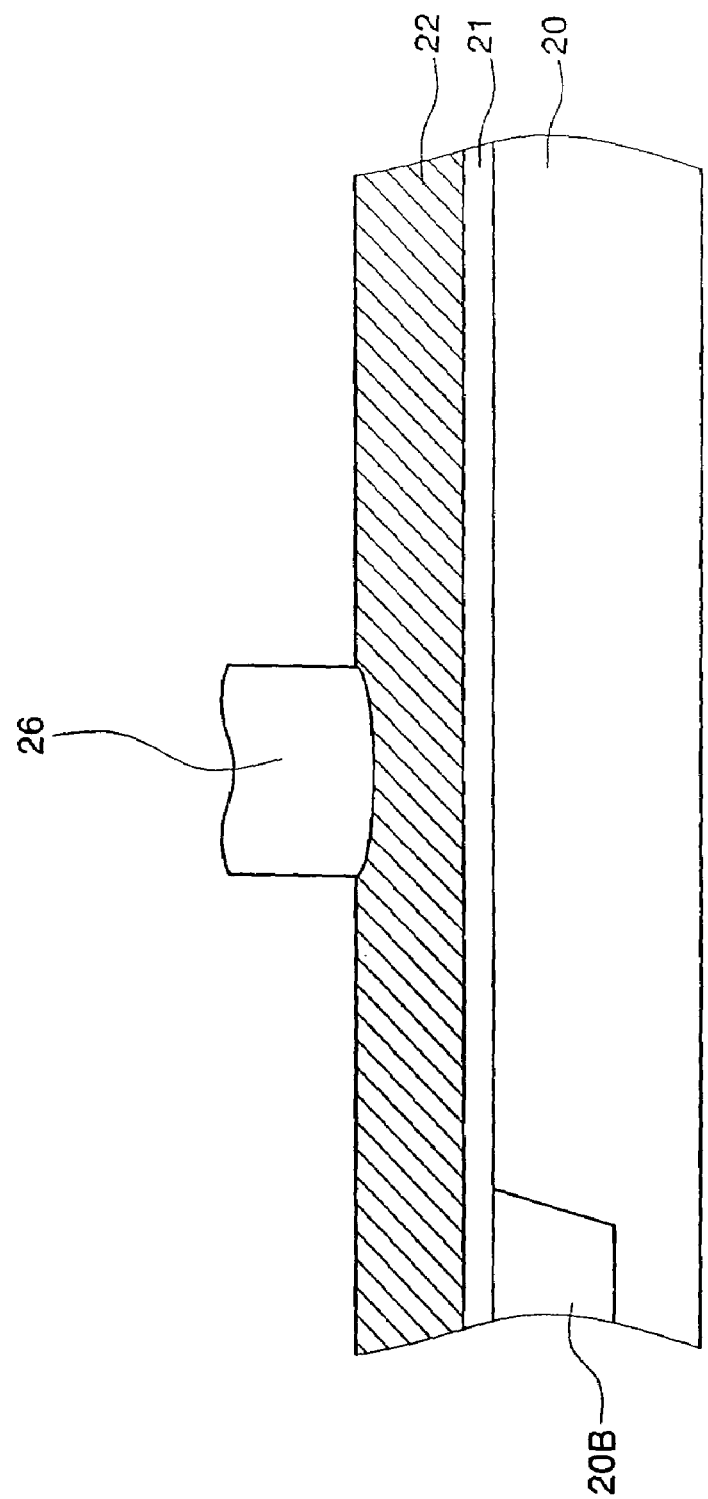
Figure 31:
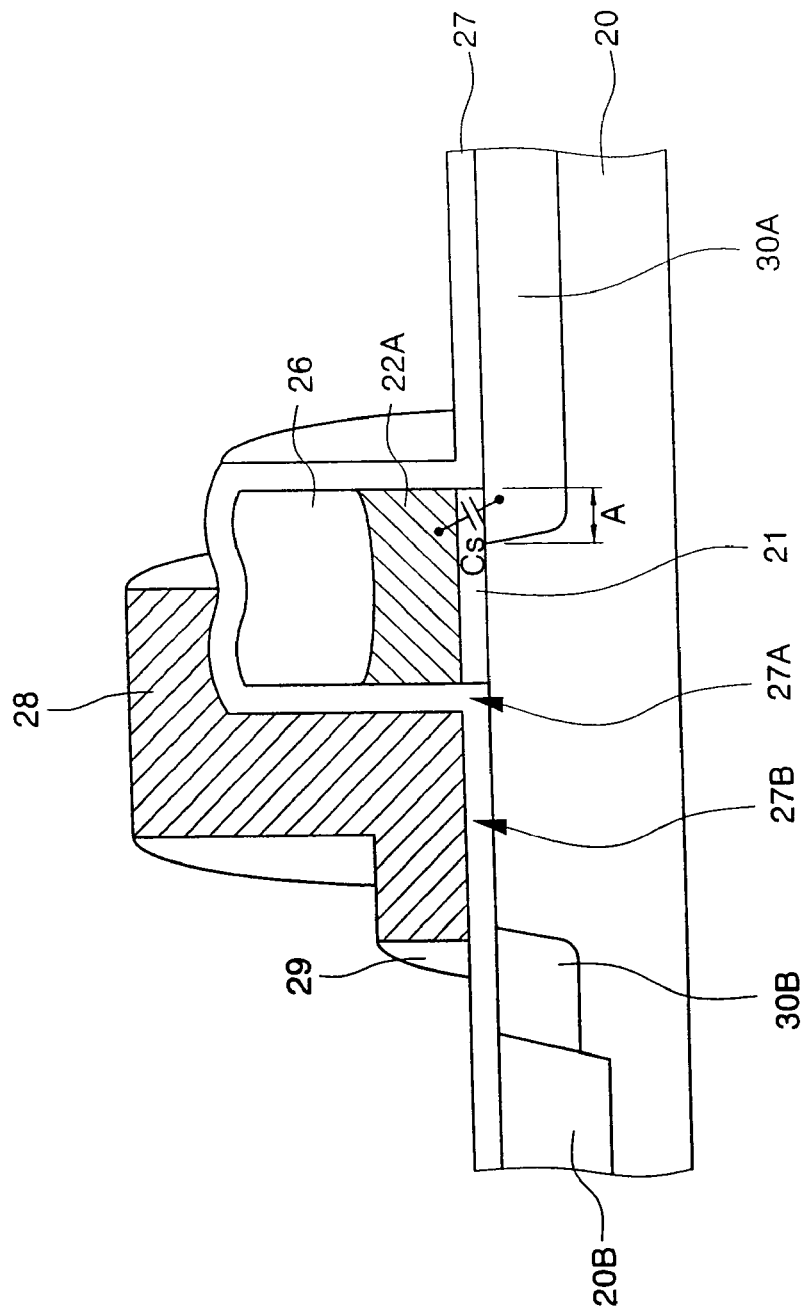

Referring to FIG. 3G, by removing the oxidation barrier pattern 23A, a side of the inter-gate oxide layer pattern 26 and parts of the floating gate layer 22, not covered with inter-gate oxide layer pattern 26, are simultaneously exposed. In the case in which the oxidation barrier pattern 23A is formed of the silicon nitride layer, the oxidation barrier pattern 23A may be removed by wet etching using an $H_3PO_4$ solution.

Referring to FIGS. 2 and 3H, a floating gate 22A is formed under the inter-gate oxide layer pattern 26 by etching the exposed floating gate layer 22 using the inter-gate oxide layer pattern 26 as an etch mask. In this case, the first gate insulating layer 21 which is thin can be removed by the etching process and the subsequent cleaning process to expose the surface of the semiconductor substrate 20. In the case in which the floating gate layer 22 is formed of the polysilicon layer, the floating gate 22A is formed by anisotropic dry etching using HBr and $Cl_2$.

On the other hand, as described above, in the case in which the etch stop layer 24 is formed by oxidizing the floating gate layer 22, the floating gate can be formed to have a tip (T in FIG. 3H) on a top end thereof. Therefore, by concentrating an electric field on the top end of the floating gate 22A, an F-N (Fowler-Nordheim) tunneling effect between the floating gate 22A and a control gate 28 can be enhanced.

Referring to FIGS. 2 and 3I, a second gate insulating layer 27 is formed on the semiconductor substrate 20 on which the formation of the floating gate 22A is completed. Thereafter, a conductive layer is deposited and patterned to form the control gate 28. One end of the control gate 28 overlaps with a portion of an upper surface of the floating gate 22A between which the inter-gate oxide layer pattern 26 is placed, one side of the control gate 28 overlaps with one side of the floating gate 22A between which the second gate insulating layer 27 is placed, and the other end of the control gate 28 overlaps with the semiconductor substrate 20. In the present embodiment, the second gate insulating layer 27 is formed of the silicon oxide layer, and the control gate 28 is formed of the polysilicon layer. An area between the floating gate 22A and the control gate 28 in the second gate insulating layer 27 serves as a tunnel insulating layer 27A.

Subsequently, spacers 29 are formed on a sidewall of the control gate 28 and the floating gate 22A. Also, a source 30A and a drain 30B are formed by performing an ion implantation process and a heat treatment process.

A program coupling ratio ($\gamma_p$) of the flash memory cell having the split-gate structure depends on a capacitance of a source capacitor Cs. Therefore, by assuring that lateral diffusion occurs when the source 30A is formed so that an overlapping area 'A' between the floating gate 22A and the source 30A may increase, the capacitance of the source capacitor Cs can be enhanced.

Figure 3J:
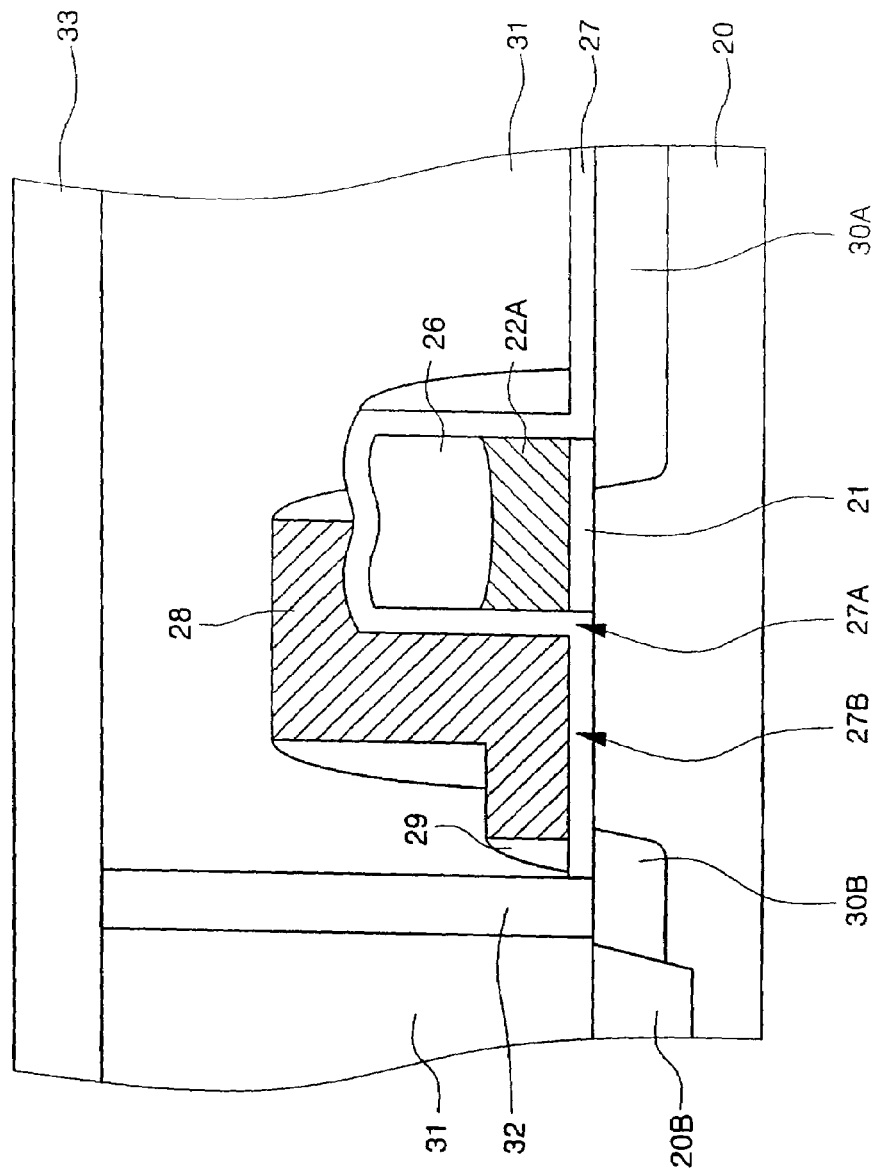

Referring to FIGS. 2 and 3J, an inter-layer insulating layer 31 is formed on the semiconductor substrate on which the formation of the spacers 29 is completed. A contact hole to expose the drain 30B is formed by selectively etching the inter-layer insulating layer 31. After a conductive plug 32 is formed in the contact hole, a bit line 33 connected to the conductive plug 32 is formed.

In the present invention, in order to insulate the floating gate 22A from the control gate 22A, the inter-gate oxide layer pattern 26 is formed by employing the spacer oxidation process. Accordingly, since the thickness of the inter-gate oxide layer pattern 26 can fully be secured even in a highly integrated circuit which is inevitably subjected to decrease in width, capacitance of an inter-gate capacitor Cip occurring between the floating gate 22A and the control gate 28 can be decreased. That is, a voltage decrease of the floating gate 22A according to the increase of the inter-gate capacitor Cip on programming can effectively be prevented, so that a drop in programming efficiency can be prevented.

As described thus far, the present invention makes it possible to form the integrate-layer oxide layer pattern in order to secure the insulation between the floating gate and the control gate by using the spacer oxidation process. Compared with the case of forming the gate oxide layer pattern using the conventional LOCOS (Local Oxidation of Silicon) process, the inter-gate oxide layer pattern according to the present invention that can be formed to have enough thickness even in a small area can effectively decrease the capacitance between the floating gate and the control gate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a flash memory cell, comprising the steps of:
   forming a first gate insulating layer, a floating gate layer and an oxidation barrier layer on a semiconductor substrate, sequentially;
   forming an oxidation barrier pattern having an opening to expose a portion of the floating gate layer by patterning the oxidation barrier layer;
   forming a spacer on a side of the opening;
   forming an inter-gate oxide layer pattern in the opening by oxidizing the spacer and the exposed floating gate layer;
   removing the oxidation barrier pattern;
   forming a floating gate on a lower part of the inter-gate oxide layer pattern by etching the floating gate layer using the inter-gate oxide layer pattern as an etch mask;
   forming a second gate insulating layer on the semiconductor substrate having the floating gate; and
   forming a control gate overlapping with a portion of the floating gate on the second gate insulating layer.

2. The method of fabricating the flash memory cell according to claim 1, wherein the spacer is formed of a polysilicon layer.

3. The method of fabricating the flash memory cell according to claim 1, wherein the oxidation process is performed at a temperature of 750° C. to 950° C.

4. The method of fabricating the flash memory cell according to claim 1, wherein the oxidation barrier layer is formed of a silicon nitride layer.

5. The method of fabricating the flash memory cell according to claim 1, wherein the step of forming the spacer comprises the steps of:
   forming a polysilicon layer covering the oxidation barrier pattern; and
   etching the polysilicon layer anisotropically.

6. The method of fabricating the flash memory cell according to claim 1, further comprising the step of forming an etch stop layer at a bottom of the opening, after forming the oxidation baffler pattern.

7. The method of fabricating the flash memory cell according to claim 6, wherein the etch stop layer is formed by oxidizing the floating gate layer exposed after forming the opening.

8. The method of fabricating the flash memory cell according to claim 7, wherein the floating gate layer is formed of a polysilicon layer.

9. The method of fabricating the flash memory cell according to claim 8, wherein the floating gate is formed to have a tip on a top end thereof.

10. The method of fabricating the flash memory cell according to claim 1, wherein the control gate is formed to have one end thereof covering a portion of the inter-gate oxide layer pattern and overlapping with a portion of the floating gate, and the other end thereof overlapping with the semiconductor substrate.

11. A method of fabricating a flash memory cell, comprising the steps of:
   defining an active area by forming an isolation layer on a semiconductor substrate;
   forming a first gate insulating layer, a floating gate layer and an oxidation barrier layer on the active area, sequentially;
   forming an oxidation barrier pattern having an opening to expose a portion of the floating gate layer by patterning the oxidation barrier layer, wherein both ends of the opening overlap with the isolation layer;
   forming a spacer on a side of the opening;
   forming an inter-gate oxide layer pattern in the opening by oxidizing the spacer and the exposed floating gate layer;
   removing the oxidation barrier pattern;
   forming a floating gate on a lower part of the inter-gate oxide layer pattern by etching the floating gate layer using the inter-gate oxide layer pattern as an etch mask;
   forming a second gate insulating layer on the active area having the floating gate;
   forming a control gate overlapping with a portion of the floating gate on the second gate insulating layer; and
   forming a source and a drain separated from each other on the active area between which the floating gate and the control gate are placed.

12. The method of fabricating the flash memory cell according to claim 11, wherein the spacer is formed of a polysilicon layer.

13. The method of fabricating the flash memory cell according to claim 11, wherein the oxidation process is performed at a temperature of 750° C. to 950° C.

14. The method of fabricating the flash memory cell according to claim 11, wherein the oxidation barrier layer is formed of a silicon nitride layer.

15. The method of fabricating the flash memory cell according to claim 11, wherein the step of forming the spacer comprises the steps of:
   forming a polysilicon layer covering the oxidation barrier pattern; and
   etching the polysilicon layer anisotropically.

16. The method of fabricating the flash memory cell according to claim 11, further comprising the step of forming an etch stop layer at a bottom of the opening, after forming the oxidation barrier pattern.

17. The method of fabricating the flash memory cell according to claim 16, wherein the floating gate layer is formed of a polysilicon layer.

18. The method of fabricating the flash memory cell according to claim 17, wherein the etch stop layer is formed by oxidizing the exposed floating gate layer.

19. The method of fabricating the flash memory cell according to claim 18, wherein the floating gate is formed to have a tip on a top end thereof.

20. The method of fabricating the flash memory cell according to claim 11, wherein the control gate is formed to have one end thereof covering a portion of the inter-gate oxide layer pattern and overlapping with a portion of the floating gate, and the other end thereof overlapping with the active area.

* * * * *

UNITED STATES PATENT AND TRADEMARK OFFICE
CERTIFICATE OF CORRECTION

| | | |
|---|---|---|
| PATENT NO. | : 7,115,470 B2 | Page 1 of 1 |
| APPLICATION NO. | : 10/840803 | |
| DATED | : October 3, 2006 | |
| INVENTOR(S) | : Jae-Hyun Park et al. | |

It is certified that error appears in the above-identified patent and that said Letters Patent is hereby corrected as shown below:

Column 7, line 42, delete "bamer" and insert --barrier--

Column 7, line 48, delete "baffler" and insert --barrier--

Signed and Sealed this

Twenty-fourth Day of April, 2007

JON W. DUDAS
*Director of the United States Patent and Trademark Office*